United States Patent
Wang et al.

(10) Patent No.: US 8,575,973 B1
(45) Date of Patent: Nov. 5, 2013

(54) FREQUENCY SYNTHESIZER WITH ZERO DETERMINISTIC JITTER

(75) Inventors: Xianyao Wang, Austin, TX (US); Peter E. Sheldon, Cedar Park, TX (US); Christopher M. Green, Austin, TX (US)

(73) Assignee: SMSC Holdings S.A.R.L., Luxembourg (LU)

( * ) Notice: Subject to any disclaimer, the term of this patent is extended or adjusted under 35 U.S.C. 154(b) by 0 days.

(21) Appl. No.: 13/481,038

(22) Filed: May 25, 2012

(51) Int. Cl.
  *H03B 21/00* (2006.01)

(52) U.S. Cl.
  USPC .......................................................... 327/105

(58) Field of Classification Search
  USPC .......................................................... 327/105
  See application file for complete search history.

(56) References Cited

U.S. PATENT DOCUMENTS

| | | | | |
|---|---|---|---|---|
| 5,202,642 A | * | 4/1993 | Dixon | 327/105 |
| 5,572,168 A | * | 11/1996 | Kasturia | 331/2 |
| 6,982,707 B2 | * | 1/2006 | Wang | 345/213 |
| 7,142,823 B1 | * | 11/2006 | Logue et al. | 455/76 |
| 7,505,542 B1 | * | 3/2009 | Lesea | 375/374 |
| 7,724,812 B2 | * | 5/2010 | Xia | 375/226 |

* cited by examiner

*Primary Examiner* — Lincoln Donovan
*Assistant Examiner* — William Hernandez
(74) *Attorney, Agent, or Firm* — King & Spalding L.L.P.

(57) ABSTRACT

A frequency synthesizer system may generate two intermediate clock signals, each intermediate clock signal having the same nominal frequency ($f_N$), the same cycle pattern with deterministic jitter, and the same corresponding average frequency ($f_A$). However, the cycle pattern in one intermediate clock signal may be a specified number (N) of cycles out of phase with respect to the cycle pattern in the other intermediate clock signal. The cycle pattern may recur every 2N cycles in each intermediate clock signal. The duration of each cycle in each of the two intermediate clock signals is defined by $f_N$ and the deterministic jitter in the cycle pattern. An output clock signal may be generated by phase interpolating by two (2) the two intermediate clock signals, and dividing the resulting phase interpolated clock signal by N. The resulting output clock signal has an accurate frequency commensurate with $f_A/N$, and is free of deterministic jitter.

22 Claims, 6 Drawing Sheets

FREQUENCY SYNTHESIZER WITH ZERO DETERMINISTIC JITTER

BACKGROUND OF THE INVENTION

1. Field of the Invention

The present invention relates generally to clock signal generation, and more specifically to generating clock signals exhibiting zero deterministic jitter.

2. Description of the Related Art

Most of today's digital systems are synchronous systems built of components operating according to one or more clock signals, which are used to coordinate the operation of the various components. Oftentimes, clock signals are generated by circuitry configured on integrated circuits (ICs), which may or may not also include other system components. On an IC (chip), an accurate clock reference is usually generated with the use of an analog phase-locked loop (PLL) locked to a crystal operating at a specified frequency. The PLL can be used to easily create clock signals having frequencies that are multiple(s) of the crystal frequency. In many cases frequency synthesizers can be used to generate other frequencies without requiring an additional crystal and/or analog PLLs. In a digital frequency synthesizer (DFS), accurate frequency is achieved by performing time averaging. The output frequency can have a cycle time of T or T±Δ, where Δ is the minimum step-size that can cause deterministic jitter.

Jitter is typically defined as the undesired deviation from true periodicity of a nominally periodic signal, often in relation to a reference clock source. Jitter can be present in characteristics such as the frequency of successive pulses, the signal amplitude, or the phase of periodic signals, and is a significant and undesired factor in the design of almost all communications links (e.g., USB, PCIe, SATA, OC-48). In general, jitter generated in digital systems ultimately reduces signal quality. For example, in the case of digital video transmission devices, jitter in a transmission path or during video clock regeneration can result in phase noise during the decoding of video signals, which reduces image quality. In high performance applications, such as PCIe/USB/MOST, any factor causing deterministic jitter (e.g. the minimum step-size for the DFS mentioned above) can make the jitter specification hard or impossible to meet, oftentimes resulting in compromised performance and in extreme cases, system malfunction.

Therefore, various solutions have been implemented over the years to minimize or eliminate jitter. One possible solution is based on an analog fractional N frequency synthesizer that is a modified version of a PLL based synthesizer, with the integer frequency divider replaced by a fractional frequency divider. Since an analog PLL is still required, this solution requires more power and additional area on the IC. Another solution features a flying adder that uses time averaging to generate different frequencies. One example of this solution is shown in FIG. 1. The output of a voltage-controlled oscillator (VCO) is provided to a multiplexer 102, which receives a 10-bit select signal from register 106. The select signal is generated by adding a current value of the content of register 106 to a frequency value input in adder 108, clocking the output of register 106 with the clock signal output from multiplexer 102. The output clock signal (Z) is then provided from the output of D Flip Flop 104. In this solution, the output deterministic jitter is limited by the minimum step-size. One way to minimize jitter is to use a smaller step-size Δ. Yet, this still requires more power and additional IC area, which can be limited by the fabrication process, among other things.

Other corresponding issues related to the prior art will become apparent to one skilled in the art after comparing such prior art with the present invention as described herein.

SUMMARY OF THE INVENTION

In one set of embodiments, a frequency synthesizer system may be operated to generate two intermediate clock signals having the same frequency but having different cycle patterns. The respective cycle patterns may be controlled individually for each intermediate clock signal. In some embodiments, the respective cycle pattern for each intermediate clock signal is controlled by a respective corresponding step-size control logic circuit, which provides a controlled respective step-size output value within the corresponding frequency synthesizer that generates the corresponding intermediate clock signal of the two intermediate clock signals. The two intermediate clock signals may be phase interpolated to generate an output clock signal having an accurate clock frequency based on the average clock frequency of the intermediate clock signals, and having zero deterministic jitter.

In one set of embodiments, a first system clock signal and a second system clock signal are generated from the same set of input clock signals with different phases. The frequency of the system clock signals is controlled by a step-size input, which determines the frequency deviation from the frequency of the input clock signals. A corresponding step control input is used to control when to add/subtract one extra difference (Δ) step value to/from the step-size input. The step control input and Δ step value are used to adjust the cycle pattern of the respective system clock signal to generate a respective cycle pattern having deterministic jitter and repeating every 2N clock cycles of the respective system clock signal.

Each intermediate clock signal is synthesized/generated based on the corresponding system clock signal and according to the corresponding step-size step control input, such that the first intermediate clock signal and the second intermediate clock signal each have the same (average) frequency and have the (same) respective cycle patterns repeating N cycles out of phase with respect to each other. In other words, the two intermediate clock signals may have the same frequency and the same respective repeating patterns of deterministic jitter every 2N clock cycles, but N clock cycles out of phase with respect to each other. The intermediate clock signals may then be phase interpolated to generate a single clock signal having a frequency corresponding to the average frequency of the intermediate clock signals, and the single clock signal may be divided by N to obtain an output clock signal that has an accurate frequency, and is free of deterministic jitter.

In one embodiment, a frequency synthesizer system (FSS) includes a first circuit for generating a first periodic signal having a first frequency and a repeating first cycle pattern with deterministic jitter, and also includes a second circuit for generating a second periodic signal having the first frequency and the repeating first cycle pattern with deterministic jitter. However, the repeating first cycle pattern in the second periodic signal recurs a number (N) of cycles out of phase with respect to the recurrence of the repeating first cycle pattern in the first periodic signal. The FSS also includes a third circuit for generating a third periodic signal from the first periodic signal and the second periodic signal, with the third periodic signal having a second cycle pattern free of deterministic jitter and repeating/recurring every N cycles. In this embodiment, the duration of each cycle is defined by the first frequency and the cycle patterns, and N is a nonzero integer.

The frequency of the third periodic signal is determined by the first frequency, and may therefore be commensurate with an average frequency of the first periodic signal and the second periodic signal. The third circuit may generate the third periodic signal by phase interpolating the first periodic signal and the second periodic signal to obtain a phase interpolated periodic signal, and dividing the phase interpolated periodic signal by N to obtain the third periodic signal. In some embodiments, the first circuit and the second circuit are identical frequency synthesizer circuits, and each includes a respective step size control circuit for controlling the repeating first cycle pattern. To control the repeating first cycle pattern, the step size control circuit controls a length of a pulse within each cycle of the repeating first cycle pattern, responsive to a step size input signal. The step size control circuit may also adjust a length of a cycle within the repeating first cycle pattern by a specified amount corresponding to a difference ($\Delta$) step input value.

BRIEF DESCRIPTION OF THE DRAWINGS

A better understanding of the present invention may be obtained when the following detailed description is considered in conjunction with the following drawings, in which.

Figure 1:
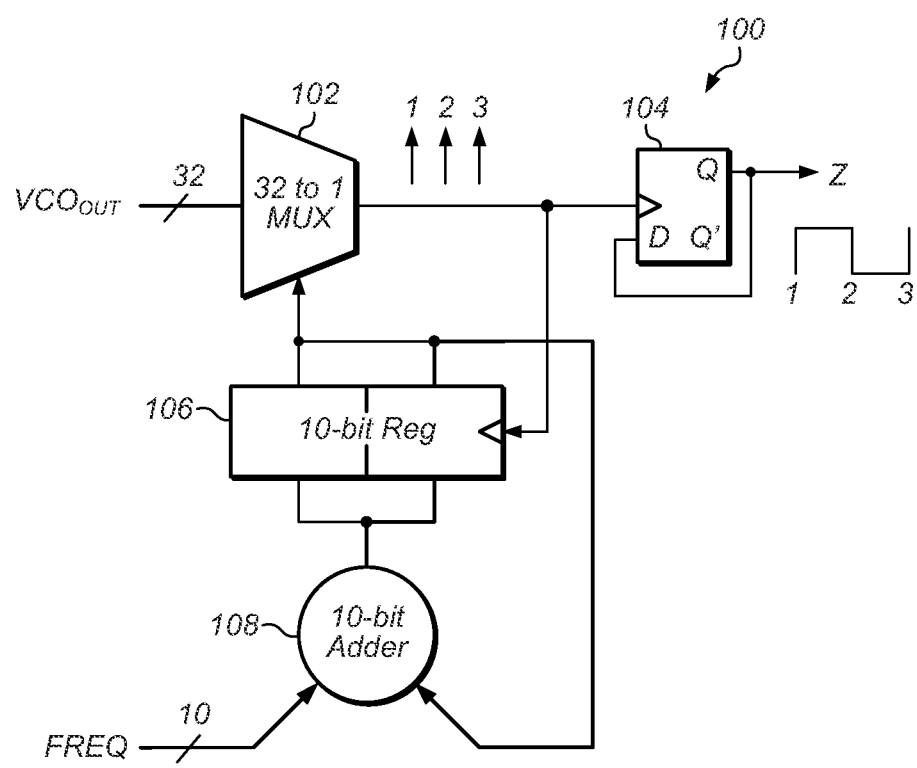
FIG. 1 shows a prior art circuit including a flying adder that uses time averaging to generate a periodic output signal of different possible frequencies.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (e.g., having the potential to or being able to in some embodiments), not a mandatory sense (i.e., must). The term "include", and derivations thereof, mean "including, but not limited to". The term "coupled" means "directly or indirectly connected".

DETAILED DESCRIPTION OF THE PREFERRED EMBODIMENTS

In one set of embodiments, a frequency synthesizer system may generate two intermediate clock signals that each have the same frequency but have different cycle patterns, such that the same pattern of deterministic jitter is repeated every 2N clock cycles in both intermediate clock signals, but with N cycles out of phase between the two intermediate clock signals. N may be selected to be any positive nonzero integer to determine the desired (final) frequency of the output clock signal. The frequency synthesizer system may phase interpolate the two intermediate clock signals, and divide the resulting single clock signal by N to generate an output clock signal having an accurate clock frequency corresponding to the average frequency of the intermediate clock signals, and also having zero deterministic jitter.

Figure 2:
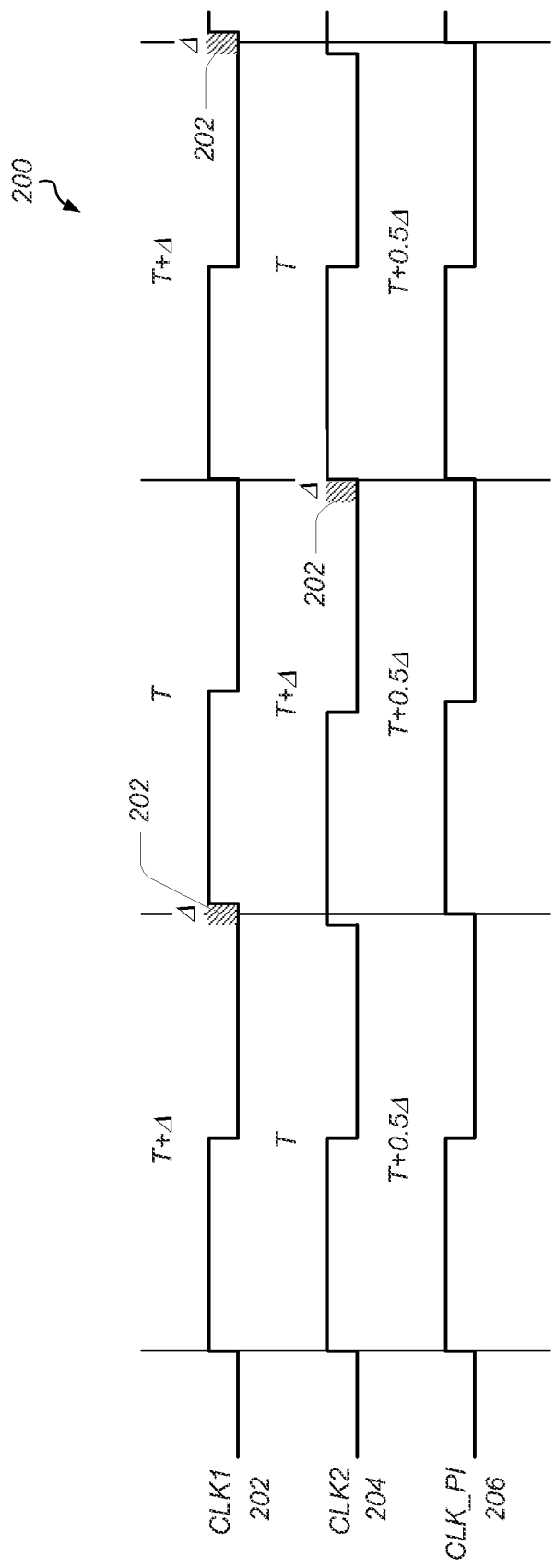
FIG. 2 shows a waveform diagram illustrating the timing of clock signals when generating zero deterministic jitter (DJ) based on clock signals with DJ=$\Delta$, according to one embodiment.

An example of two clock signals each having a different cycle pattern with the same respective repeating pattern of deterministic jitter is provided in FIG. 2. As shown in waveform diagram 200 in FIG. 2, clock signals CLK1 and CLK2 each have an average cycle time of T+0.5$\Delta$, where $\Delta$ is the minimum step-size (of specified/specifiable length) causing jitter. The minimum step-size $\Delta$ is illustrated as shaded area(s) 202 in FIG. 2. Accordingly, clock signals CLK1 and CLK2 have a cycle-to-cycle deterministic jitter of $\Delta$ with respect to each other. For each clock signal, the deterministic jitter of $\Delta$ recurs every two (2) cycles, resulting in the average cycle period of T+0.5$\Delta$. However, CLK1 is composed of period sequences of (T+$\Delta$, T) relative to (or with respect to) CLK2, which is composed of period sequences (T, T+$\Delta$) relative to (or with respect to) CLK1. So while the example clock signals CLK1 and CLK2 each feature the same cycle pattern, the cycle pattern of CLK1 is a single cycle out of phase with respect to the cycle pattern of CLK2, resulting in the deterministic jitter of $\Delta$ occurring cycle-to-cycle when considering both CLK1 and CLK2. To put it another way, the same jitter $\Delta$ recurs every other cycle in each clock signal, in alternate clock cycles of CLK1 and CLK2. In order to remove the existing deterministic jitter $\Delta$, a phase interpolator may be used to obtain an interpolated clock signal CLK_PI having a cycle time (period) of T+0.5$\Delta$, which is the same as the average cycle time of both CLK1 and CLK2, resulting in CLK_PI being free of deterministic jitter, that is, CLK_PI having zero deterministic jitter. In case of the example clock signals CLK1 and CLK2 shown in FIG. 2, N=1, which results in CLK_PI, obtained from phase interpolating CLK1 and CLK2, being free of jitter.

Figure 3:
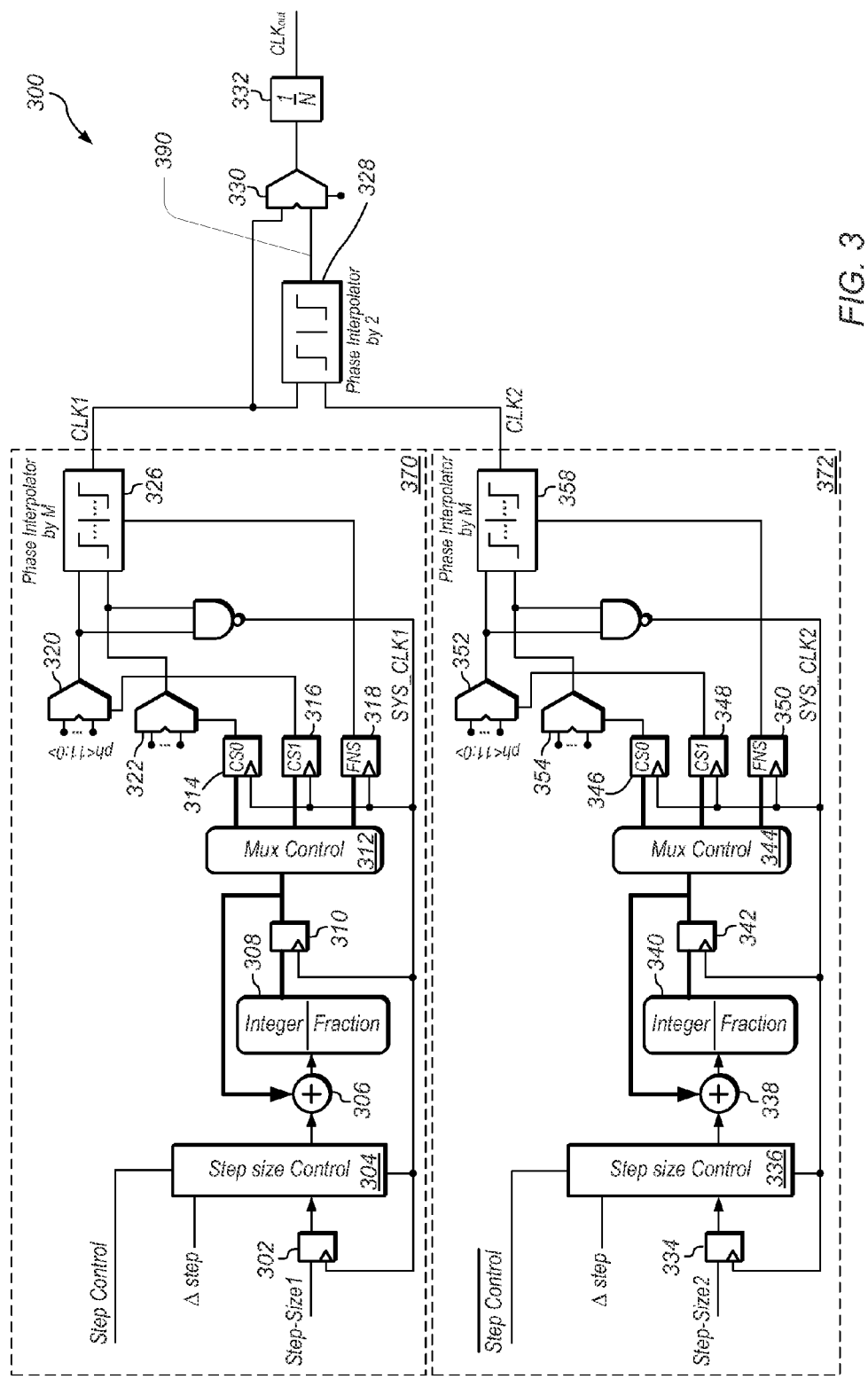
FIG. 3 shows a partial logic diagram of one embodiment of an architecture of a frequency synthesizer with zero deterministic jitter.

FIG. 3 shows one embodiment of a frequency synthesizer system 300 that may be operated to generate a clock signal having zero deterministic jitter. The system 300 includes two frequency synthesizers 370 and 372 that generate two respective clock signals, CLK1 and CLK2, both having the same nominal frequency and the same corresponding average frequency (or same average cycle period). Frequency synthesizers 370 and 372 may be designed to be identical, producing matching clock signals CLK1 and CLK2. At the same time, step-size control logic 304 and 336 may be set up to obtain a CLK1 signal and a CLK2 signal, respectively, that each have cycle time sequences with the same repeating pattern of deterministic jitter but out of phase with respect to each other, similar to the out of phase cycle time sequences illustrated in FIG. 2. A phase interpolator 328 may be used to generate a clock signal having an average cycle time corresponding to the average cycle time of CLK1 and CLK2. The resulting output $CLK_{out}$ is a clock signal having zero deterministic jitter. It should be noted here that factors other than minimum step-size can also cause deterministic jitter. For example, a mismatch between interpolator steps can cause differential non-linearity (DNL) that can translate into deterministic clock jitter. The thermal and 1/f noise, i.e. flicker noise can also cause random jitter.

One important aspect of system 300 is the design of step-size control logic 304/336. As shown in FIG. 3, step-size control logic 304 is operating in a different clock domain than step-size control logic 336. Specifically, step-size control logic 304 is operating in a first clock domain clocked with a first system clock signal SYS_CLK1, while step-size control logic 336 is operating in a second clock domain clocked with a second system clock signal SYS_CLK2. As shown in FIG. 3, SYS_CLK1 is generated from the same set of input clock signals with different phases input into multiplexers 320 and 322. Similarly, SYS_CLK2 is generated from the same set of input clock signals with different phases input into multiplexers 352 and 354. The frequency of SYS_CLK1 may be controlled by the Step-Size1 input signal, while the frequency of SYS_CLK2 may be controlled by the Step-Size2 input signal. Therefore, input signal Step-Size1 determines the frequency deviation of SYS_CLK1 from the frequency of the respective input clock signals provided to multiplexers 320 and 322, and input signal Step-Size2 determines the frequency deviation of SYS_CLK2 from the frequency of the respective input clock signals provided to multiplexers 352 and 354.

Overall, frequency synthesizer 370 is operating in the first clock domain to generate CLK1 using SYS_CLK1, and frequency synthesizer 372 is operating in the second clock domain to generate CLK2 using SYS_CLK2. Step-size control logic 304 is operated to provide a Step-Size output value to adder 306 according to the Step Control input and Δ step input, and based on the step-size input "Step-Size1" provided to latch 302. Similarly, step-size control logic 336 is operated to provide a Step-Size output value to adder 338, according to an inverse value of the Step Control signal (i.e. the inverse of the value of Step Control provided to step-size control circuit 304), and based on the step-size input "Step-Size2" provided to latch 336, and the Δ step input provided to step-size control logic 336.

The Step Control signal may be specified to represent the control action "adding Δ at N and not at 2N", where 'N' refers to a specified number of cycles, and the control action corresponds to adding/subtracting a first Δ step to/from the step-size value at the Nth cycle, and every 2N cycles thereafter. It should be noted that the Δ step may be positive or negative, and therefore Δ step may be either added or subtracted from the step-size value input into the step-size control circuit. Consequently, "adding Δ at N and not at 2N" corresponds to adding or subtracting a first Δ step to or from the corresponding clock signal at the Nth cycle of the clock signal, and adding or subtracting a Δ step every 2N cycles thereafter, whereas the inverse of "adding Δ at N and not at 2N" corresponds to adding or subtracting a first Δ step to or from the corresponding clock signal at the end of 2N cycles of the clock signal, and adding or subtracting a Δ step every 2N cycles thereafter. Conversely, the Step Control signal may be specified to represent "adding Δ at 2N and not at N", also corresponding to adding or subtracting a first Δ step at the end of 2N cycles of the clock signal, and adding or subtracting a Δ step every 2N cycles thereafter. In either case, when the Step Control signal is asserted at the input of one of the step-size control logic blocks 304 and 336, it is deasserted at the input of the other one of the step-size control logic blocks 304 and 336. Accordingly, a Δ step may be added/subtracted to/from one of the clock signals every N cycles, alternating between SYS_CLK1 and SYS_CLK2. In other words, the Δ step may be added/subtracted in SYS_CLK1 N cycles out of phase with respect to SYS_CLK2 (and vice versa).

As shown in the embodiment of FIG. 3, the Step Control signal is provided to step-size control block 304 while the inverse of the Step Control signal is provided to step-size control block 336. Referring to the clock timing diagrams of FIG. 2, the Step Control signal in FIG. 3 corresponds to the control action "adding Δ at N and not at 2N", and is asserted at step-size control logic block 304, and deasserted at step-size control logic block 336, to yield the example clock signals shown in FIG. 2, for N=1.

According to the different clock domains, registers/latches 302, 310, 314, 316, and 318 are all clocked by SYS_CLK1 in frequency synthesizer (FRS) 370, while registers/latches 334, 342, 346, 348, and 350 are all clocked by SYS_CLK2 in FRS 372. In FRS 370, latches 314 and 316 are used to store coarse select values CS0 and CS1, respectively, while latch 318 is used to store fine select value FNS. Similarly, in FRS 372, latches 346 and 348 are used to store coarse select values CS0 and CS1, respectively, while latch 350 is used to store fine select value FNS. The values input into phase interpolator 326 are selected from multiplexers 320 and 322, while the values input into phase interpolator 358 are selected from multiplexers 352 and 354. Phase interpolators 326 and 358 are used to increase step accuracy during generation of CLK1 and CLK2. The Step-Size output value provided to adder 306 is processed in Integer/Fraction block 308, the output of which is stored in latch/register 310 from which it is clocked into multiplexer control logic 312, to store the respective select signals in latches/registers 314-318. Similarly, the Step-Size output value provided to adder 338 is processed in Integer/Fraction block 340, the output of which is stored in latch/register 342 from which it is clocked into multiplexer control logic 344, to store the respective select signals in latches/registers 346-350. Overall, the step-size output value determines the length of the given cycle for that cycle.

Figure 4:
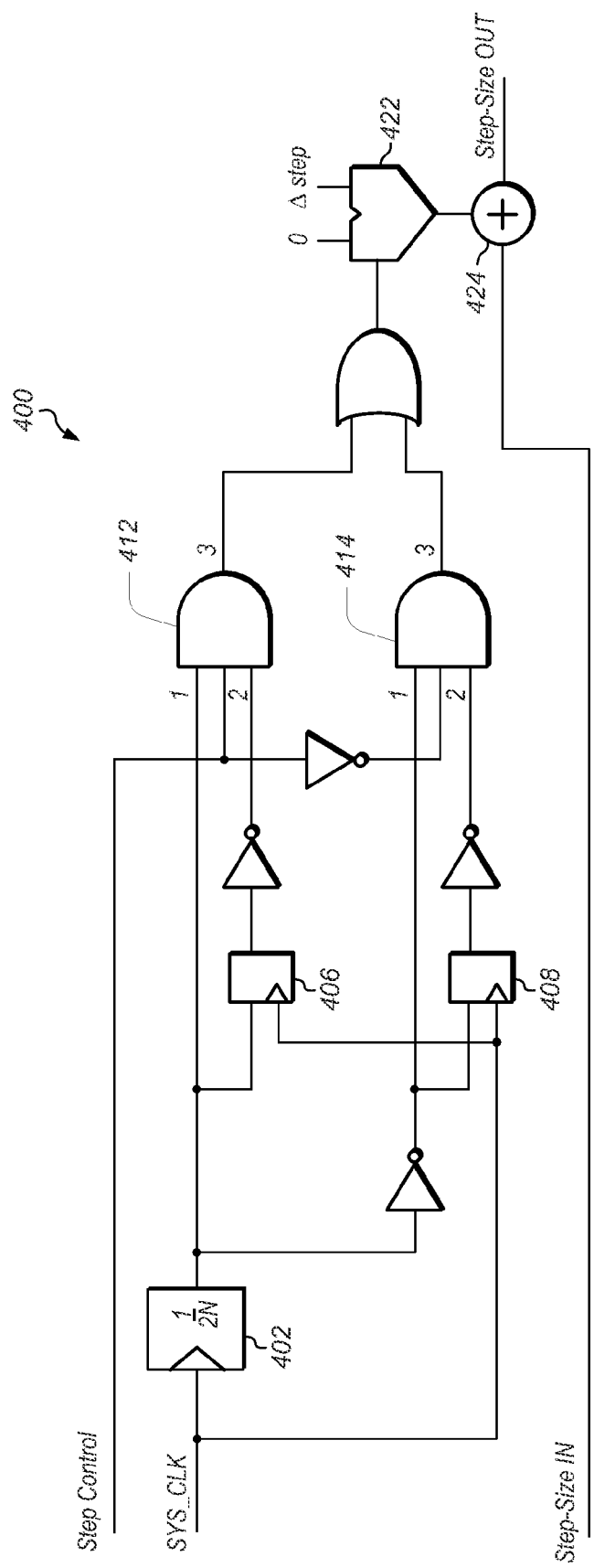
FIG. 4 shows a partial logic diagram of one embodiment of a circuit that performs step-size control.

As previously mentioned, the design of step-size control logic 304/336 affects how well the frequency synthesizer system 300 operates, and because the respective control logic of frequency synthesizers 370 and 372 are running in two different respective clock domains (SYS_CLK1 and SYS_CLK2), two step-size control circuits 304 and 336 are used to generate the necessary step-size output values. The logic diagram of one possible embodiment of the implementation of a step-size control circuit is shown in FIG. 4. Step-size control blocks 304 and 336 shown in FIG. 3 may each be implemented as a respective instance of step-size control circuit 400. For example, the Step Control input, Δ step input, Step-Size IN input and SYS_CLK input may each couple to the respective corresponding signals "Step Control", the registered version of "Step-Size1" from latch 302, "Δ step", and "SYS_CLK1", for step-size control block 304 as shown in FIG. 3. Similarly, the Step Control input, Step-Size IN input, Δ step input, and SYS_CLK input (shown in FIG. 4) may each couple to the respective corresponding signals "Step Control<bar>", the registered version of "Step-Size2" from latch 334, "Δ step", and "SYS_CLK2", for step-size control block 336 as also shown in FIG. 3.

Circuit 400 generates a signal to add and/or subtract an extra Δ (or multiple of Δ) step, effectively adding/subtracting extra time Δ/(2N) to/from one cycle. The Δ step (or multiple thereof) is added/subtracted every 2N cycles, N cycles out of phase between CLK1 and CLK2. Which of the clock signals has the Δ step (or multiple thereof) added/subtracted first, depends on the value of the Step Control signal. In the embodiment shown in FIG. 4, if the Step Control signal='1' (i.e. when the Step Control signal is asserted), then one extra Δ (or multiples of Δ) may be first added or subtracted at the N-th cycle, and every 2N cycles thereafter. When the Step Control signal is deasserted, the extra Δ is first added/subtracted after the 2N-th cycle, and every 2N cycles thereafter. As a result, in both cases the generated intermediate clock signals CLK1 and CLK2 have repeated patterns every 2N cycles, for example as illustrated in FIG. 2. It should be noted that other embodiments of the step-size control circuit may feature a Step Control signal with a different assertion level corresponding to adding/subtracting the first $\Delta$ step at the N-th cycle or the 2N-th cycle. Overall, the structure of circuit 400 allows for adding/subtracting the first $\Delta$ step at either the N-th cycle or the 2N-th cycle, depending on the assertion level of the Step Control input signal. Therefore, in system 300 shown in FIG. 3, the respective cycle patterns of CLK1 and CLK2 may be generated to be N cycles out of phase between CLK1 and CLK2, by providing the Step Control signal to one step-size control circuit (e.g. to circuit 304/circuit 336) and providing an inverse of the Step Control signal to the other step-size control circuit (e.g. to circuit 336/circuit 304).

Following phase interpolation in interpolator 328 (referring again to FIG. 3), the interpolated clock output 390 of interpolator 328 has repeated patterns every N cycles. Output clock $CLK_{out}$ is obtained by using divider 332 to divide by N the interpolated clock 390. Accordingly, the frequency of $CLK_{out}$ is $f_d/N$, where $f_d$ is the frequency with which the cycle patterns having deterministic jitter occur in interpolated clock signal 390. As a result, $CLK_{out}$ has zero deterministic jitter. Consequently, the deterministic jitter caused by a minimum step-size $\Delta$ is eliminated while high accurate frequency resolution is maintained.

As shown in FIG. 4, the clock input SYS_CLK into control circuit 400 is divided by 2N in divider 402. The divided clock signal is provided as the data input into latch 406, and as an input to NAND gate 412, while the inverse of the divided clock signal is provided as the data input into latch 408, and as an input into NAND gate 414. The Step Control signal is used for gating the respective outputs of NAND gates 412 and 414 to provide the select signal to multiplexer 422, to select when to add $\Delta$ (step) to the Step-Size input using adder 424. The output of adder 424 is provided as the Step-Size output. Overall, step-size control circuit 400 may operate to define the length and pattern of each cycle of the periodic signal that is generated by the frequency synthesizer in which the step-size control circuit is configured. The nominal frequency of the periodic signal is obtained responsive to the step-size input, while the actual (average frequency) is determined responsive, in addition, to the $\Delta$ step input determining how much the given cycle is lengthened/shortened each 2N-th cycle, beginning at the first N-th cycle or first 2N-th cycle responsive to the value of the Step Control input. To put it another way, the overall cycle pattern of the periodic signal may be controlled responsive to the Step Control and $\Delta$ step inputs, while the nominal frequency of the periodic signal may be obtained responsive to the Step-Size input.

Figure 5:
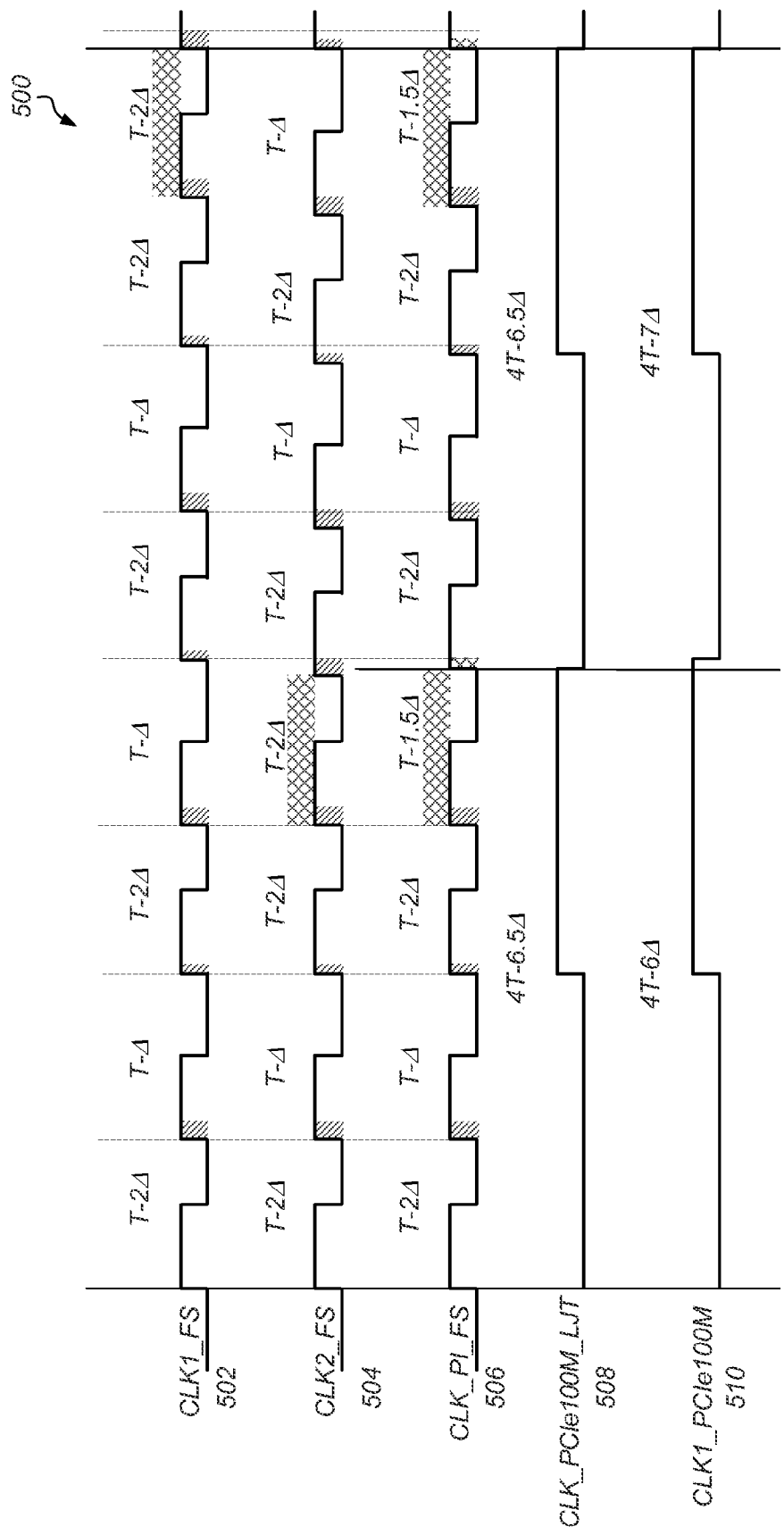
FIG. 5 shows a waveform diagram illustrating the timing of clock signals when generating a 100 MHz PCIe reference clock, according to one embodiment.

FIG. 5 shows a waveform/timing diagram 500 illustrating clock signals generated by FSR system 300 when generating a clock signal having an accurate frequency and being free of deterministic jitter according to one embodiment. Specifically, FIG. 5 shows a timing diagram 500 illustrating the timing of clock signals when generating a 100 MHz PCIe reference clock using FRS system 300, with step-size control blocks 304 and 336 implemented according to the control circuit shown in FIG. 4. CLK1_FS and CLK2_FS, the waveforms of which are shown in FIG. 5, may be 400 MHz clocks generated from twelve (12) phases of a source clock signal "FS clock". Specifically, CLK1_FS and CLK2_FS may each be created by subtracting $13\Delta$ from the FS clock for every eight-cycle time period, and outputting the result. A single (phase interpolated) 400 MHz clock may then be created from CLK1_FS and CLK2_FS, and the desired 100 MHz PCIe clock may be generated by dividing the 400 MHz clock by N=4. To meet a ±300 ppm (parts per million) frequency accuracy specification, the generated 400 MHz clock is expected to have an accuracy of approximately ±100 ppm (when using a crystal having an accuracy of approximately ±200 ppm). The period of the FS clock for this example is $T=96\,\Delta$, where $\Delta=26.5$ ps (picoseconds), yielding a period of 2.544 ns (nanoseconds). For a cycle period of T=2.5 ns (corresponding to 400 MHz), the desired T is achieved by multiplying $\Delta$ with (96−13/8), that is, $T=(96-13/8)*\Delta$, which has an accuracy of about 33.5 ppm (error), and therefore meets the overall error specification.

As mentioned above, according to the arrangement shown in FRS system 300, to generate a single 100 MHz PCIe clock signal that is free of deterministic jitter, two 400 MHz clocks, CLK1_FS and CLK2_FS may first be generated. As seen in waveform diagram 500, CLK1_FS 502 (which corresponds to CLK1 of FIG. 3) exhibits repeated cycle patterns of (T−2Δ, T−Δ), except the 8th cycle (that is, the (2N)-th cycle), which is also T−2Δ instead of the expected T−Δ. CLK2_FS 504 (which corresponds to CLK2 of FIG. 3) also exhibits cycle patterns of (T−2Δ, T−Δ), except the 4th cycle (that is, the N-th cycle), which is also T−2Δ instead of the expected T−Δ. Referring back to FRS system 300, the cycle pattern of CLK1_FS is generated by subtracting a first Δ step at the 2N-th cycle, and subtracting a Δ step every 2N cycles thereafter, in SYS_CLK1. In this case, the Step Control signal input to step-size control block 304 is deasserted. Conversely, the cycle pattern of CLK2_FS is generated by subtracting a first Δ step at the N-th cycle, and subtracting a Δ step every 2N cycles thereafter, in SYS_CLK2, and the Step Control signal input to step-size control block 304 is asserted.

After interpolation of CLK1_FS and CLK2_FS in interpolator 328, the interpolated clock CLK_PI_FS 506 has a repeated pattern every 4 cycles (that is, every N cycle). In other words, the cycle same pattern (T−2Δ, T−Δ, T−2Δ, T−1.5Δ) repast every N (4) cycles. After dividing by 4 (that is, dividing by N) the 100 MHz CLK_PCIe100M_LJT 508 has a cycle period (4T−6.5Δ) that equals the time period of each recurring cycle pattern of CLK_PI_FS. Consequently, CLK_PCIe100M_LJT 508 has zero deterministic jitter. Referencing FIG. 3, clock signal 508 is the clock signal output by interpolator 328, prior to dividing the resultant clock signal in divider 332. The other clock signal, that is, the 100 MHz CLK1_PCIe100M 510 signal may be created by dividing CLK1_FS directly by 4. In the system 300 shown in FIG. 3, this clock may be obtained by selecting the CLK1 input at multiplexer 330 to provide CLK1 to divider 332, which produces a $CLK_{out}$ signal that is simply a divided (by N) version of CLK1. However, this clock signal has a cycle period of repeating cycle patterns of (4T−6Δ) and (4T−7Δ), so it has a deterministic jitter of Δ.

Figure 6:
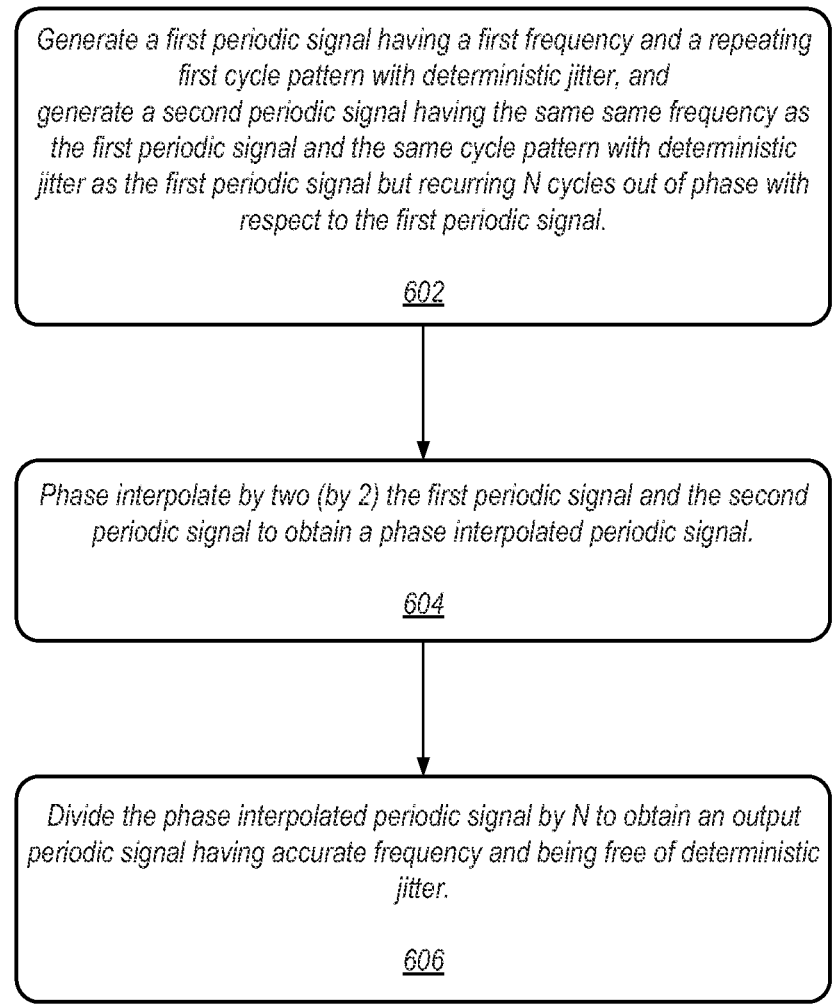
FIG. 6 shows a flow diagram of one embodiment of a method to generate a periodic signal with zero deterministic jitter.

FIG. 6 shows a flow diagram illustrating one embodiment of a method to generate a periodic signal having an accurate frequency and having no deterministic jitter. The periodic signal may be generated using two frequency synthesizers, a phase interpolator, and a divide circuit. As shown in FIG. 6, the method may include generating a first periodic signal having a first frequency and a repeating first cycle pattern with deterministic jitter, and generating a second periodic signal also having the first frequency and the same repeating first cycle pattern with deterministic jitter but recurring a number of cycles (N cycles) out of phase with respect to the first periodic signal (602). The first periodic signal and the second periodic signal may then be phase interpolated by 2 to obtain a phase interpolated periodic signal (604). The phase interpolated signal may have a second cycle pattern recurring every N cycles, and have an overall average frequency commensurate with the average frequency of the first periodic signal and second periodic signal as defined by the first frequency and the deterministic jitter. The phase interpolated signal may then be divided by N to obtain an output periodic signal free of deterministic jitter (606). The duration of each cycle of the N cycles is defined by the first frequency and the deterministic jitter, and N is specified to be a nonzero integer. In one set of embodiments, the first periodic signal and the second periodic signal may be generated through identically constructed circuits, e.g. the frequency synthesizers 370 and 372 shown in FIG. 3.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims. For example, while the specific embodiments provided herein focus on an established PCIe standard and provides examples of PCIe clocks, other embodiments may equally be designed to be implemented with other standards and corresponding clock signals.

We claim:

1. A frequency synthesizer system (FSS) comprising:
a first circuit configured to generate a first periodic signal having a first frequency and a repeating first cycle pattern with deterministic jitter;
a second circuit configured to generate a second periodic signal having the first frequency and the repeating first cycle pattern with deterministic jitter, wherein the repeating first cycle pattern in the second periodic signal is a first number (N) of cycles out of phase with respect to the repeating first cycle pattern in the first periodic signal; and
a third circuit configured to generate a third periodic signal from the first periodic signal and the second periodic signal, wherein the third periodic signal has a second cycle pattern free of deterministic jitter and repeating every N cycles;
wherein a duration of each cycle of the N cycles is defined by the first frequency and the repeating first cycle pattern; and
wherein N is a nonzero integer.

2. The FSS of claim 1, wherein the third periodic signal has a second frequency determined by the first frequency and the deterministic jitter.

3. The FSS of claim 1, wherein the third circuit is configured to generate the third periodic signal by phase interpolating the first periodic signal and the second periodic signal.

4. The FSS of claim 1, wherein to generate the third periodic signal, the third circuit is configured to:
phase interpolate the first periodic signal and the second periodic signal to obtain a phase interpolated periodic signal; and
divide the phase interpolated periodic signal by N to obtain the third periodic signal.

5. The FSS of claim 1, wherein the first circuit and the second circuit are identical frequency synthesizer circuits.

6. The FSS of claim 1, wherein the first circuit and the second circuit each comprise a respective step-size control circuit configured to control the repeating first cycle pattern.

7. The FSS of claim 6, wherein to control the repeating first cycle pattern, the step-size control circuit is configured to control a length of a pulse within each cycle of the repeating first cycle pattern, responsive to a step-size input signal.

8. The FSS of claim 6, wherein the step-size control circuit is configured to adjust a length of a cycle within the repeating first cycle pattern by a specified amount corresponding to a difference ($\Delta$) step input value.

9. A method for generating a periodic signal having an accurate frequency and having no deterministic jitter, the method comprising:
generating a first periodic signal having a first frequency and a repeating first cycle pattern with deterministic jitter;
generating a second periodic signal having the first frequency and the repeating first cycle pattern with deterministic jitter, comprising generating the second periodic signal to have the repeating first cycle pattern in the second periodic signal recur a first number (N) of cycles out of phase with respect to the recurrence of the repeating first cycle pattern in the first periodic signal; and
generating a third periodic signal from the first periodic signal and the second periodic signal, wherein the third periodic signal has a second cycle pattern free of deterministic jitter and repeating every N cycles;
wherein a duration of each cycle of the N cycles is defined by the first frequency and the deterministic jitter; and
wherein N is a nonzero integer.

10. The method of claim 9, wherein the third periodic signal has a second frequency determined by the first frequency and the deterministic jitter.

11. The method of claim 9, wherein said generating the third periodic signal comprises phase interpolating the first periodic signal and the second periodic signal.

12. The method of claim 9, wherein said generating the third periodic signal comprises:
phase interpolating the first periodic signal and the second periodic signal to obtain a phase interpolated periodic signal; and
dividing the phase interpolated periodic signal by N to obtain the third periodic signal.

13. The method of claim 9, comprising generating the first periodic signal and the second periodic signal through identically constructed circuits.

14. The method of claim 9, further comprising controlling a length of a pulse within each cycle of the repeating first cycle pattern, responsive to a step-size input signal.

15. The method of claim 9, further comprising adjusting a length of a cycle within the repeating first cycle pattern by a specified amount corresponding to a difference ($\Delta$) step input value.

16. A frequency synthesizer system (FSS) comprising:
a first frequency synthesizer configured to generate a first periodic signal having a nominal frequency and composed of a repeating first cycle pattern that includes deterministic jitter, the first periodic signal having a corresponding average frequency defined by the nominal frequency and the deterministic jitter;
a second frequency synthesizer configured to generate a second periodic signal having the nominal frequency and composed of the repeating first cycle pattern that is a first number (N) of cycles out of phase with respect to the first repeating cycle pattern in the first periodic signal, the second periodic signal having the corresponding average frequency; and an output circuit configured to generate a third periodic signal by combining the first periodic signal and the second periodic signal, wherein the third periodic signal has a repeating second cycle pattern free of deterministic jitter and repeating every N cycles;

wherein each cycle corresponds to the average frequency; and wherein N is a nonzero integer.

17. The FSS of claim 16, wherein the third periodic signal has a frequency commensurate with average frequency divided by N.

18. The FSS of claim 16, wherein the output circuit comprises:

a phase interpolator configured to phase interpolate by two (2) the first periodic signal and the second periodic signal to obtain a phase interpolated periodic signal; and a divider circuit configured to divide the phase interpolated periodic signal to produce the third periodic signal.

19. The FSS of claim 16, wherein the first frequency synthesizer and the second frequency synthesizer comprise identical circuitry.

20. The FSS of claim 16, wherein the first frequency synthesizer comprises a first step-size control circuit configured to control a pulse length within each cycle of the first periodic signal responsive to a first step-size input;

and wherein the second frequency synthesizer comprises a second step-size control circuit configured to control a pulse length within each cycle of the second periodic signal responsive to a second step-size input.

21. The FSS of claim 20, wherein the first step-size control circuit is further configured to adjust a length of a cycle of the first periodic signal every 2N cycles according to a first difference ($\Delta$) step input, and responsive to a first step control input; and wherein the second step-size control circuit is further configured to adjust a length of a cycle of the second periodic signal every 2N cycles according to a second $\Delta$ step input, and responsive to a second step control input.

22. The FSS of claim 21, wherein the output circuit is further configured to deassert the second step control input when the first step control input is asserted, and assert the second step control input when the first step control input is deasserted.

* * * * *